United States Patent
Yajima et al.

(10) Patent No.: US 6,470,823 B2
(45) Date of Patent: Oct. 29, 2002

(54) APPARATUS AND METHOD FOR FORMING A DEPOSITED FILM BY A MEANS OF PLASMA CVD

(75) Inventors: Takahiro Yajima, Kyoto-fu; Masahiro Kanai, Tokyo; Yuzo Koda; Takeshi Shishido, both of Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/771,650

(22) Filed: Jan. 30, 2001

(65) Prior Publication Data

US 2001/0025601 A1 Oct. 4, 2001

(30) Foreign Application Priority Data

Jan. 31, 2000 (JP) .......................... 2000-023081

(51) Int. Cl.$^7$ ........................... C23C 16/00; H01L 21/00
(52) U.S. Cl. ................ 118/723 E; 118/723 R; 118/718
(58) Field of Search ................. 118/723 R, 723 E, 118/718; 156/345, 43

(56) References Cited

U.S. PATENT DOCUMENTS

| | | | |
|---|---|---|---|
| 4,978,412 A | * 12/1990 | Aoki et al. | 156/345 |
| 5,227,203 A | * 7/1993 | Kibe et al. | 427/523 |
| 5,275,683 A | * 1/1994 | Arami et al. | 156/345 |
| 5,575,855 A | 11/1996 | Kanai et al. | 118/718 |
| 5,589,007 A | 12/1996 | Fujioka et al. | 136/249 |
| 5,695,566 A | * 12/1997 | Suzuki et al. | 118/723 E |
| 5,851,299 A | * 12/1998 | Cheng et al. | 118/729 |
| 6,025,039 A | * 2/2000 | Yajima | 427/573 |
| 6,271,055 B1 | * 8/2001 | Yajima et al. | 438/97 |

FOREIGN PATENT DOCUMENTS

| JP | 93056850 | 8/1993 |
|---|---|---|
| JP | 6232434 | 8/1994 |

* cited by examiner

*Primary Examiner*—Gregory Mills
*Assistant Examiner*—Michelle Crowell
(74) *Attorney, Agent, or Firm*—Fitzpatrick, Cella, Harper & Scinto

(57) ABSTRACT

A film-forming apparatus comprising a vacuum chamber, a power application electrode, a raw material gas introduction portion through which a raw material gas is introduced into the vacuum chamber, and an exhaustion portion through which the vacuum chamber is exhausted, the power application electrode being arranged so as to oppose a substrate for film formation positioned in the vacuum chamber, characterized in that at least said raw material gas introduction portion or the exhaustion portion is provided with an opening adjusting member having a desired thickness for intercepting the plasma, and the power application electrode and the opening adjusting member are arranged to satisfy an equation a or $c \geq b$, with a being a shortest distance between the power application electrode and the opening adjusting member provided at the raw material gas introduction portion, c being a shortest distance between the power application electrode and the opening adjusting member provided at the exhaustion portion, and b being an average distance between the substrate and a horizontal plane face of the power application electrode which is opposed to a face of the substrate.

6 Claims, 5 Drawing Sheets

F I G. 2
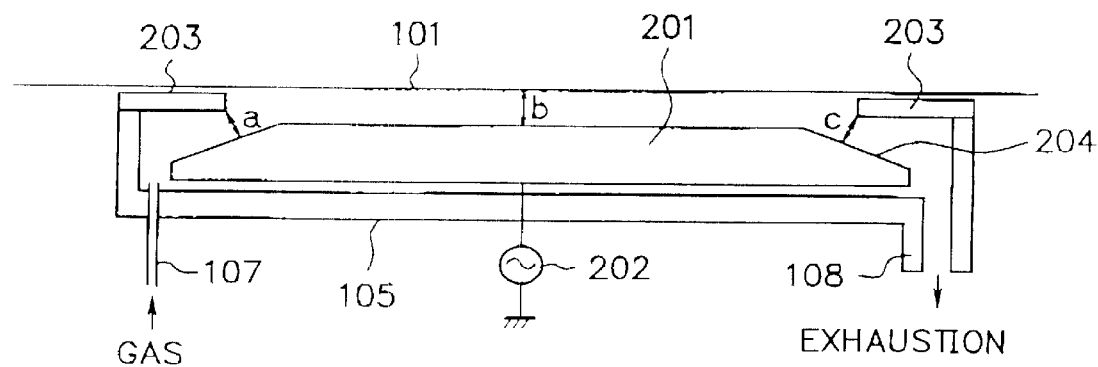
F I G. 3
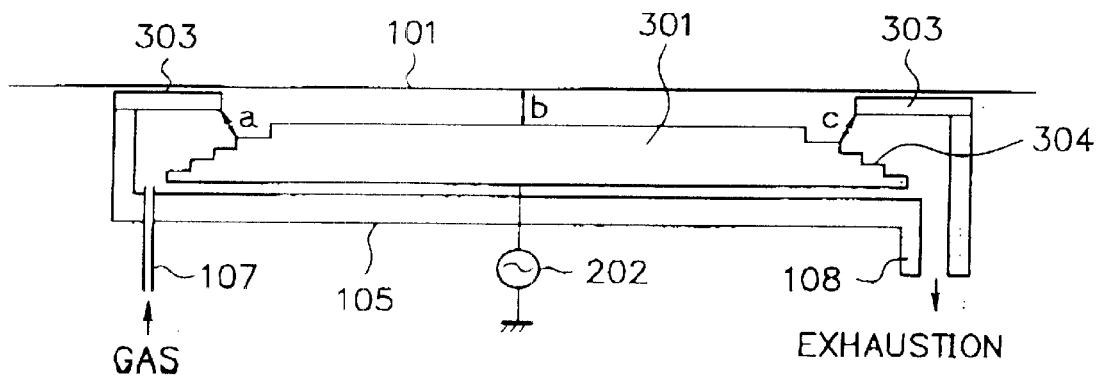

PRIOR ART (COMPARATIVE EXAMPLE)

PRESENT INVENTION

APPARATUS AND METHOD FOR FORMING A DEPOSITED FILM BY A MEANS OF PLASMA CVD

BACKGROUND OF THE INVENTION

1. Field of the Invention

The present invention relates to an apparatus and a method for forming a deposited film on a substrate which is arranged in a vacuum vessel so as to oppose an discharging power application electrode arranged in said vacuum vessel by generating a plasma between said substrate and said electrode to decompose a raw material gas present in said vacuum vessel whereby depositing a film on said substrate.

2. Related Background Art

As a typical example of an electronic device in which a photovoltaic element is used, there can be mentioned a solar cell which converts sunlight energy or other light energy into electric energy. Recently, public attention has focused on the power generation system using a solar cell since the solar cell has advantages such that it is safe, can be readily handled and that it can be used as a power generation source of providing clean energy without causing $CO_2$ buildup.

Separately, there have proposed a variety of amorphous semiconductor materials capable of being used in the production of an electronic device including a solar cell. Of these amorphous semiconductor materials, attention has riveted to amorphous silicon (a-Si) semiconductor materials since they have advantages such that they can be readily formed in a thin film having a large area with a relatively large design freedom with respect to their composition, they can be readily controlled in a wide range with respect to their electric and optical characteristics, and therefore, they are suitable as constituents of various electronic devices including solar cells. Particularly, a film comprising such a-Si semiconductor material (hereinafter referred to as "a-Si film") is more advantageous in comparison with a film comprising a crystalline silicon semiconductor material (hereinafter referred to as "crystalline Si film"). That is, the a-Si film has an absorption coefficient against an energy near the energy distribution peak of sunlight which is greater than that of the crystalline Si film, the a-Si film can be formed at a lower film-forming temperature (substrate temperature) than that in the formation of the crystalline Si film, and the a-Si film can be directly formed on a given substrate from a silicon-containing raw material by way glow discharge. In view of this, the a-Si film has been generally recognized as being suitable as a constituent of a solar cell and in fact, it has been widely using in the production of a solar cell.

Now, for a solar cell which has been considered to be important as a part of the future energy measure, it is an immediate necessity in terms of the research and development to lower the production cost and to more improve the performance. In order to attain the production of a solar cell at a desirably low production cost, attention has riveted to an amorphous silicon (a-Si) semiconductor material capable of readily formed in a thin film state. Hitherto, there have been proposed various a-si semiconductor films having a relatively high photoelectric conversion efficiency in terms of the performance. However, these a-si semiconductor films are still insufficient in terms of lowering the production cost. As one of the reasons for this, there can be mentioned a subject in that their film-forming speed (their deposition rate) is slow. For instance, in the case of producing a p-i-n junction type solar cell by means of a glow discharge decomposition method, its i-type semiconductor layer is generally formed at a deposition rate of 0.1 to 2 Å/sec which is relatively slow. In this case, in order to complete the formation of the i-type semiconductor layer having a thickness of 4000 Å, it takes about 30 minutes to about 2 hours which is relatively a long period of time. As a method of forming such a-Si semiconductor layer having a relatively large thickness at a high deposition rate, there has been an attempt in that 100% $SiH_4$ gas or 100% $Si_2H_6$ gas is used. Besides, Japanese Patent Publication No. 56850/1993 describes that the deposition rate of a deposited film can be increased by shortening the distance between a power application electrode and a substrate capable of being served as an electrode.

Separately, Japanese Unexamined Patent Publication No. 232434/1994 discloses a process for mass-producing a photovoltaic element (a solar cell) using a roll-to-roll type film-forming apparatus. The roll-to-roll type film forming apparatus comprises a plurality of film-forming vacuum chambers having a discharge space communicated with each other through a gas gate which is provided between each adjacent film-forming vacuum chambers to isolate the inner atmosphere of the discharge space of one film-forming vacuum chamber from that of the other film-forming vacuum chamber, each of said plurality of film-forming vacuum chambers having a discharging power application electrode extending from a power source, a raw material gas introduction means extending from a raw material gas supply system and an exhaustion means connected to a vacuum pump, wherein a web substrate is moved to sequentially pass through the respective film-forming vacuum chambers and the respective gas gates while forming a functional deposited film comprising an amorphous silicon material or the like on said web substrate by each of the film-forming vacuum chambers, and said web substrate having a plurality of functional deposited films sequentially formed thereon is taken up by a take-up means while being wound thereon. The process using this roll-to-roll type film-forming apparatus excels in the productivity of a photovoltaic element (a solar cell).

Now, in the case where an amorphous silicon deposited film is formed on a substrate arranged in a deposition chamber by means of plasma CVD, in the vicinity of a region of the deposition chamber where a raw material gas is supplied into the deposition chamber, a plasma generated there contains non-decomposed raw material gas in a relatively large amount and because of this, there is a tendency in that a deposited film formed on said substrate in the vicinity of said region of the deposition chamber becomes to have an uneven film thickness or an inferior film property. In addition, also in the vicinity of a region of the deposition chamber where the deposition chamber is exhausted, a plasma generated there is liable to disorder, resulting in somewhat deteriorating a deposited film formed on said substrate. Particularly in the case of using such roll-to-roll type film-forming apparatus as above described, deposited films formed on a web substrate respectively in the vicinity of a region of each film-forming vacuum chamber where a raw material gas is supplied into the film-forming vacuum chamber (the discharge space) through the raw material gas introduction means and in the vicinity of a region of each film-forming vacuum chamber where the film-forming vacuum chamber is exhausted through the exhaustion means are also liable to have such defects as above described, where such defective deposited films result in forming an n/i interface and an i/p interface which greatly influence to characteristics of a photovoltaic element (a solar cell) produced.

In order to prevent such defective deposited films from being formed on the web substrate, there is known a manner in that an opening adjusting member as shown in FIG. 9 is provided in each film-forming vacuum chamber so as to cover the foregoing region of the film-forming vacuum chamber where such defective deposited film is formed on the web substrate.

However, in the case where the deposition rate of a deposited film formed a substrate (or a web substrate) is intended to increase by shortening the distance between the power application electrode and the substrate as previously described, there will be an occasion in that the distance between the power application electrode and the opening adjusting member becomes to be smaller than the distance (b) between the power application electrode and the substrate (see, FIG. 9).

In this case, disadvantages are liable to occur such that turbulence such as stagnancy or accumulation occurs in the flow of a raw material gas around a portion where the distance between the power application electrode and the substrate is small, whereby deposition of a thin film is hindered or/and dust including polysilane power is generated.

Besides, because the opening adjusting member also functions as a grounding electrode, in the case where the distance between the power application electrode and the opening adjusting member is diminished, the distance between the power application electrode and the substrate eventually comes to a result that it is diminished to the corresponding extend, where there is an occasion in that the deposition rate of the deposited film formed the substrate is locally increased.

SUMMARY OF THE INVENTION

In view of the foregoing disadvantages in the prior art, the present invention makes it an object to provide an improvement in a film-forming apparatus by means of plasma CVD comprising a substantially enclosed vacuum chamber whose inside being capable of being evacuated, a power application electrode for introducing a discharging power into said vacuum chamber, said power application electrode being arranged so as to oppose a substrate positioned in said vacuum chamber, and an opening adjusting member for adjusting a film-forming area of said substrate positioned in said vacuum chamber, so that a high quality deposited film can be stably and continuously formed on said substrate even when the distance between said power application electrode and said substrate is shortened in order to increase a deposition rate for said deposited film formed on said substrate.

Another object of the present invention is to provide a film-forming method using said plasma CVD film-forming apparatus.

A further object of the present invention is to provide a film-forming apparatus comprising at least a substantially enclosed vacuum chamber whose inside being capable of being evacuated, a power application electrode for introducing a discharging power into said vacuum chamber, a raw material gas introduction portion through which a raw material gas is introduced into said vacuum chamber, and an exhaustion portion through which said vacuum chamber is exhausted, said power application electrode being arranged so as to oppose a substrate positioned in said vacuum chamber, wherein a discharging power is introduced through said power application electrode to generate a plasma in a discharge space between said power application electrode and said substrate to decompose a raw material gas introduced through said raw material gas introduction portion whereby causing deposition of a film on said substrate, characterized in that at least said raw material gas introduction portion or said exhaustion portion is provided with an opening adjusting member for intercepting said plasma, and said opening adjusting member is provided to have a distance between said power application electrode, which is greater than a shortest distance between said power application electrode and said substrate.

A further object of the present invention is to provide a film-forming method using aforesaid film-forming apparatus in that said raw material gas which is flown from said raw material gas introduction portion toward said exhaustion portion is decomposed by said plasma generated in said discharge space between said power application electrode and said substrate to cause deposition of a film on said substrate.

BRIEF DESCRIPTION OF THE DRAWINGS

FIG. 2 is a schematic cross-sectional view illustrating an example of a positional arrangement of a power application electrode, an opening adjusting member, and a substrate in a film-forming apparatus of the present invention.

FIG. 3 is a schematic cross-sectional view illustrating another example of a positional arrangement of a power application electrode, an opening adjusting member, and a substrate in a film-forming apparatus of the present invention.

DESCRIPTION OF THE INVENTION AND PREFERRED EMBODIMENTS

Figure 1:
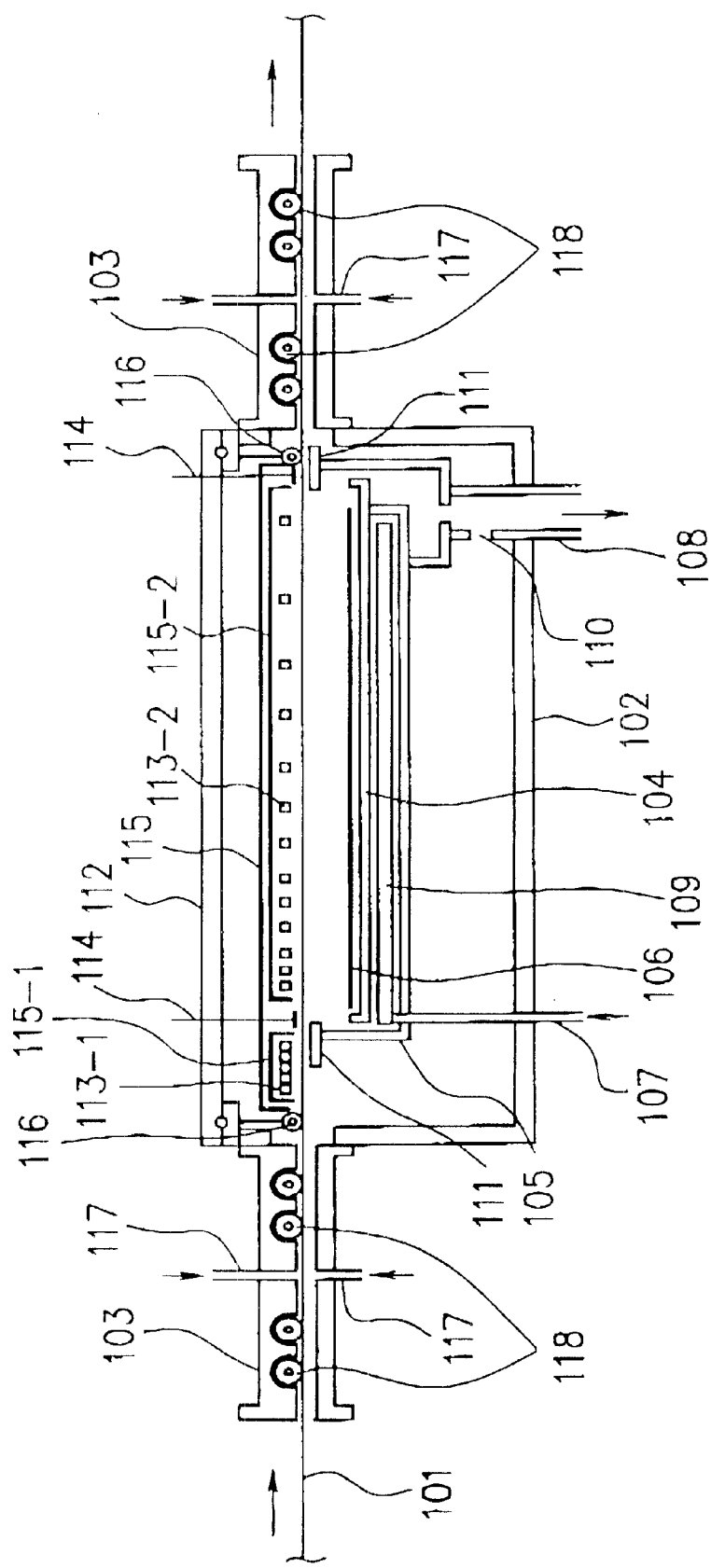
FIG. 1 is a schematic diagram illustrating the constitution of an example of a film-forming apparatus of the present invention.

The present invention eliminates the foregoing disadvantages found in the prior art and attain the above described objects.

As previously described, the present invention includes an improved film-forming apparatus and a film-forming method using said film-forming apparatus.

A typical embodiment of a film-forming apparatus according to the present invention comprises at least a substantially enclosed vacuum chamber whose inside being capable of being evacuated, a power application electrode for introducing a discharging power into said vacuum chamber, a raw material gas introduction portion through which a raw material gas is introduced into said vacuum chamber, and an exhaustion portion through which said vacuum chamber is exhausted, said power application electrode being arranged so as to oppose a substrate positioned in said vacuum chamber, wherein a discharging power is introduced through said power application electrode to generate a plasma in a discharge space between said power application electrode and said substrate to decompose a raw material gas introduced through said raw material gas introduction portion whereby causing deposition of a film on said substrate, characterized in that at least said raw material gas introduction portion or said exhaustion portion is provided with an opening adjusting member for intercepting said plasma, and said opening adjusting member is provided to have a distance between said power application electrode, which is greater than a shortest distance between said power application electrode and said substrate.

The present invention provides a film-forming method using said film-forming apparatus, characterized in that said raw material gas which is flown from said raw material gas introduction portion toward said exhaustion portion is decomposed by said plasma generated in said discharge space between said power application electrode and said substrate to cause deposition of a film on said substrate.

In the film-forming apparatus of the present invention, it is preferred that a face of a side portion of the power application electrode on the side of the substrate is configured to have a gradient configuration in that the thickness of said power application electrode is gradually decreased toward an end portion of said side portion of said power application electrode which is situated on a reverse side to the substrate (for example; see, reference numeral 201 in FIG. 2). Separately, it is preferred that a face of the opening adjusting member on the side of the power application electrode is configured to have a gradient configuration in that the thickness of said opening adjusting member is gradually decreased toward an opening portion of the vacuum chamber where the substrate is exposed to the inside (the discharge space) of the vacuum chamber, where the gradient configuration of the opening adjusting member is preferred to oppose the foregoing gradient configuration of the power application electrode (for example; see, reference numerals 501 and 503 in FIG. 5).

In the present invention, even when the distance between the power application electrode and the substrate which is arranged to oppose the power application electrode is shortened in order to increase the deposition rate for a deposited film formed on the substrate, because the opening adjusting member is provided to have a distance between the power application electrode, which is greater than the shortest distance between the power application electrode and the substrate, as above described, turbulence such as stagnancy or accumulation is not occurred in the flow of the raw material gas and dust including polysilane power is prevented from occurring, where a high quality deposited film is stably and continuously formed on the substrate.

Further in the present invention, as above described, it is preferred that a face of a side portion of the power application electrode on the side of the substrate is configured to have a gradient configuration in that the thickness of said power application electrode is gradually decreased toward an end portion of said side portion of said power application electrode which is situated on a reverse side to the substrate. In addition, it is preferred that a face of the opening adjusting member on the side of the power application electrode is configured to have a gradient configuration in that the thickness of said opening adjusting member is decreased toward an opening portion of the vacuum chamber where the substrate is exposed to the inside (the discharge space) of the vacuum chamber, where the gradient configuration of the opening adjusting member is preferred to oppose the foregoing gradient configuration of the power application electrode.

By adopting such constitution as described in the above, there is not an occasion in that the distance between the power application electrode and the substrate is largely changed. Because of this, a plasma is always generated in a stable state in the discharge space of the vacuum chamber without being disordered, where deposited films formed on the substrate respectively in a region in the vicinity of the raw material gas introduction portion and in a region in the vicinity of the exhaustion portion are prevented from having an uneven thickness.

Incidentally, as above described, the power application electrode functions as a counter electrode to the substrate which functions as an electrode. By applying a discharging power comprising an electric power selected from a group consisting of a D.C. power, a low frequency power with an oscillation frequency in a range of 5 kHz to less than 500 kHz, a high frequency power with an oscillation frequency in a range of 500 kHz to less than 30 MHz, and a VHF power with an oscillation frequency in a range of 30 MHz to about 500 MHz through the power application electrode, it is possible to generate a D.C. plasma, a low frequency plasma, a high frequency plasma, or a VHF plasma in the vacuum chamber (the discharge chamber), whereby the raw material gas introduced into the vacuum chamber is decomposed to cause deposition of a functional deposited film as a semiconductor film on the substrate.

The substrate may be a member made of a translucent insulating material such as glass or the like or a member made of a non-translucent electrically conductive material such as a stainless steel or the like. Besides, the substrate may be an elongated web substrate comprising a flexible insulating member such as a polymer film or the like having an electrically conductive thin film formed thereon or a flexible electrically conductive member made of a stainless steel or the like.

In the present invention, chiefly for the purpose of increasing the deposition rate for a deposited film formed on the substrate, the distance between the power application electrode and the substrate is preferred to be 50 mm or less. For the purpose of generating a plasma having a high stability while adequately increasing the deposition rate for a deposited film formed on the substrate, it is desired for the distance between the power application electrode and the substrate to be preferably in a range of more than 5 mm or more preferably in a range from 10 mm to 30 mm.

FIG. 1 is a schematic diagram illustrating the constitution of a principal part of a capacitive coupling type film-forming apparatus as an example of a film-forming apparatus of the present invention.

As an opening adjusting member (111) in the film-forming apparatus shown in FIG. 1, an appropriate opening adjusting member (203, 303, 403, 503) shown in any of FIGS. 2 to 5 is adopted.

In FIG. 1, there is shown only one vacuum vessel (vacuum chamber) for the simplification purpose.

In FIG. 1, reference numeral 102 indicates a vacuum vessel (or a vacuum chamber) in a rectangular form which is situated between adjacent vacuum vessels (not shown) positioned on either sides of the vacuum vessel 102, where the vacuum vessel 102 is communicated with each adjacent vacuum vessel through a gas gate 103 provided with a separation gas introduction pipe 117. By introducing a separation gas comprising, for instance, $H_2$ gas or He gas into the gas gate 103 through the separation gas introduction pipe 117, it is possible to isolate the gaseous atmosphere and the inner pressure (the gas pressure) in the vacuum vessel 102 from those in each adjacent vacuum vessel situated next to the vacuum vessel 102.

The adjacent vacuum vessel positioned on the left side (in the figure) may be a vacuum vessel having the same structure as the vacuum vessel 102 or a substrate-loading vacuum vessel form which a substrate is delivered. Similarly, the adjacent vacuum vessel positioned on the right side (in the figure) may be a vacuum vessel having the same structure as the vacuum vessel 102 or a substrate-unloading vacuum vessel which takes up a substrate.

Reference numeral 105 indicates a discharge chamber in a rectangular form which is provided in the vacuum vessel 102. Reference numeral 101 indicates a web substrate which is transported from the adjacent vacuum vessel (not shown) positioned on the left side (in the figure) of the vacuum vessel 102 while passing through the gas gate 103 to enter in the vacuum vessel 102 where the web substrate is situated to cover the top open face of the discharge chamber 105, then the web substrate 101 is carried out from the vacuum vessel 102 to enter in the adjacent vacuum vessel (not shown) positioned on the right side (in the figure) of the vacuum vessel 102 while passing through the gas gate 103 on the right side of the vacuum vessel 102.

The discharge chamber 105 is provided with a gas feed pipe 107 for introducing a raw material gas into the discharge chamber The gas feed pipe 107 is extending from a raw material gas supply system (not shown). The discharge chamber 105 is also provided with an exhaust pipe 108 which is connected to a vacuum pump (not shown) through a throttle valve (not shown). The exhaust pipe 108 is provided with an exhaustion port 110 which is open outside the discharge chamber 105.

Reference numeral 106 indicates a power application electrode which is provided in the discharge chamber 105. The power application electrode 106 is provided to as to oppose the surface of the web substrate 101 which is faced to the inside space of the discharge chamber 105, where the power application electrode 106 functions as a counter electrode to the web substrate 101 which functions as an electrode.

Figure 4:
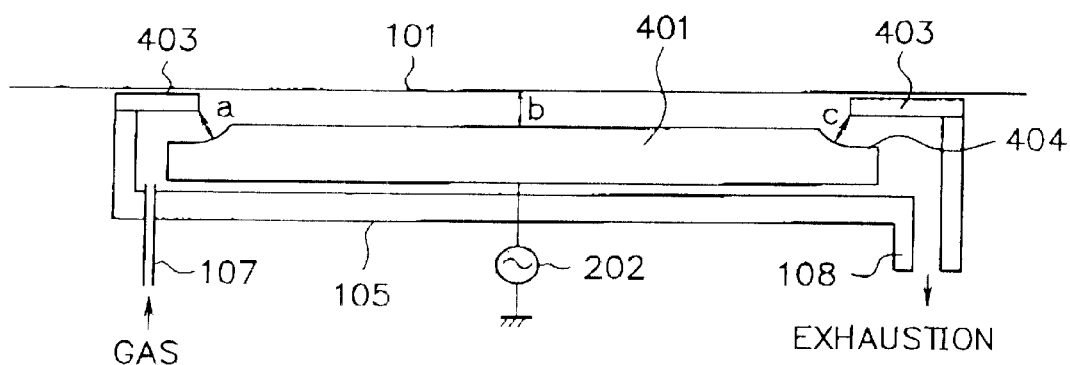
FIG. 4 is a schematic cross-sectional view illustrating a further example of a positional arrangement of a power application electrode, an opening adjusting member, and a substrate in a film-forming apparatus of the present invention.

Here, the power application electrode 106 is preferred to be in a form having a cross-sectional pattern indicated by reference numeral 201 in FIG. 2, reference numeral 301 in FIG. 3, or reference numeral 401 in FIG. 4. Detailed description will be made later of these figures.

The power application electrode 106 is electrically connected to a high frequency power source in this embodiment. Reference numeral 109 indicates a block heater which is provided on the back side of the power application electrode 106 in the discharge chamber 105.

Reference numeral 113-1 indicates a preheating means comprising a lamp heater unit which is arranged in the vacuum vessel 102 as shown in FIG. 1, and reference numeral 113-2 indicates a regular heating means comprising a lamp heater unit which is also arranged in the vacuum vessel 102 as shown in FIG. 1. Reference numeral 115-1 indicates a reflector for the preheating means 113-1, reference numeral 115-2 a reflector for the regular heating means 113-2, and reference numeral 115 a reflector for the entirety of the preheating means 113-1 and the regular heating means 113-2. Reference numeral 114 indicates a thermocouple. The preheating means 113-1 serves to provisionally heat the web substrate 101 before the web substrate is entered in the discharge chamber 105, and the regular heating means 113-2 serves to substantially heat the provisionally heated web substrate to have a prescribed substrate temperature required for the film formation in the discharge chamber 105.

Reference numeral 118 indicates a magnet roller which is provided along the passage of the gas gate 103 for the web substrate 101. Reference numeral 116 indicates a sustaining roller to sustain the web substrate 101. Reference numeral 112 indicates a cover of the vacuum vessel 102. Reference numeral 111 indicates an opening adjusting member for adjusting an opening of the discharge chamber 105. Reference numeral 104 indicates a foundation member for the power application electrode 106.

Now, the web substrate 101 is transported while being provisionally heated by means of the preheating means 113-1 to enter in the discharge chamber 105, where the web substrate 101 is substantially heated to and maintained at a prescribed temperature by means of the regular heating means 113-2 while adjusting the temperature of the web substrate by means of the thermocouples 114, and the high frequency power source (not shown) is switched on to apply a discharging power comprising a high frequency power into the discharge chamber 105 through the power application electrode 106 to generate glow discharge in the present of a raw material gas in the discharge chamber where a plasma is generated to decompose the raw material gas whereby causing formation of a desired functional deposited film (a desired semiconductor film) on the surface of the web substrate 101 which is faced to the inside space (the discharge space) of the discharge chamber 105. Specifically in this case, prescribed raw material gas from the raw material gas supply system (not shown) is introduced into the discharge chamber 105 through the gas feed pipe 107, where the raw material gas is heated by means of the block heater 109. At this time, the raw material gas flows in parallel to the transportation direction of the web substrate 101, followed by flowing above the power application electrode 106, then the raw material gas is exhausted by the exhaust pipe 108 outside the discharge chamber 105 then outside the vacuum vessel 102, wherein part of the separation gas which is introduced into the gas gate 103 through the separation gas introduction pipe 117 and flown into the discharge chamber 105 and part of the raw material gas introduced into the discharge chamber 105 are exhausted through the exhaustion port 110 provided at the exhaust pipe 108.

In the following, description will be made of a positional arrangement relationship of the power application electrode, the opening adjusting member, and the substrate in a film-forming apparatus of the present invention with reference to the drawings.

Figure 5:
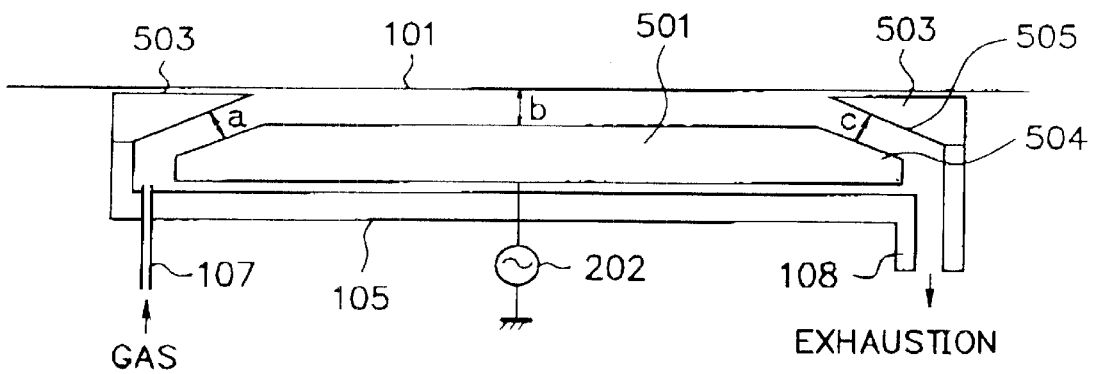
FIG. 5 is a schematic cross-sectional view illustrating a still further example of a positional arrangement of a power application electrode, an opening adjusting member, and a substrate in a film-forming apparatus of the present invention.

FIG. 2 is a schematic cross-sectional view illustrating an example of a positional arrangement of a power application electrode, an opening adjusting member, and a substrate in a film-forming apparatus of the present invention. FIG. 3 is a schematic cross-sectional view illustrating another example of a positional arrangement of a power application electrode, an opening adjusting member, and a substrate in a film-forming apparatus of the present invention. FIG. 4 is a schematic cross-sectional view illustrating a further example of a positional arrangement of a power application electrode, an opening adjusting member, and a substrate in a film-forming apparatus of the present invention. FIG. 5 is a schematic cross-sectional view illustrating a still further example of a positional arrangement of a power application electrode, an opening adjusting member, and a substrate in a film-forming apparatus of the present invention.

In FIGS. 2 to 5, reference numeral 101 indicates a substrate (corresponding to the web substrate 101 in FIG. 1), reference numeral 105 a discharge chamber (corresponding to the discharge chamber 105 in FIG. 1), reference numeral 107 a gas feed pipe (corresponding to the gas feed pipe 107 in FIG. 1), and reference numeral 108 a exhaust pipe (corresponding to the exhaust pipe 108 in FIG. 1). Reference numeral 202 indicates a power source.

In FIG. 2, reference numeral 201 indicates a power application electrode (corresponding to the power application electrode 106 in FIG. 1) which is electrically connected to the power source 202, and reference numeral 203 an opening adjusting member (corresponding to the opening adjusting member 111 in FIG. 1). As shown in FIG. 2, the power application electrode 201 is configured such that a surface thereof on the substrate side has a gradient pattern 204 (which forms a gradient face) at each of its either side end portions, said gradient pattern being gradient downward from the substrate side in that the thickness of the power application electrode is gradually decreased downward from the substrate side. Further, as shown in FIG. 2, there are provided two opening adjusting members 203, one being provided at a substrate carrying-in opening of the discharge chamber 105 so as to cover the raw material gas introduction portion of the discharge chamber from above where the gas feed pipe 107 is open to introduce a raw material gas into the discharge chamber, and the other being provided at a substrate carrying-out opening of the discharge chamber 105 so as to cover the exhaustion portion of the discharge chamber from above where the exhaust pipe 108 is open to exhaust the inside of the discharge chamber.

In FIG. 2, each of "a" and "c" indicates the shortest distance between the power application electrode 201 and the opening adjusting member 203, and "b" indicates a distance (an average distance) between the substrate 101 and a horizontal plane face of the power application electrode 201 which is opposed to the surface of the substrate 101.

In FIG. 3, reference numeral 301 indicates a power application electrode (corresponding to the power application electrode 106 in FIG. 1) which is electrically connected to the power source 202, and reference numeral 303 an opening adjusting member (corresponding to the opening adjusting member 111 in FIG. 1). As shown in FIG. 3, the power application electrode 301 is configured such that a surface thereof on the substrate side has a stepwisely gradient pattern 304 (which forms a stepwisely gradient face) at each of its either side end portions, said stepwisely gradient pattern being stepwisely gradient downward from the substrate side in that the thickness of the power application electrode is stepwisely decreased downward from the substrate side. Further, as shown in FIG. 3, there are provided two opening adjusting members 303, one being provided at a substrate carrying-in opening of the discharge chamber 105 so as to cover the raw material gas introduction portion of the discharge chamber from above where the gas feed pipe 107 is open to introduce a raw material gas into the discharge chamber, and the other being provided at a substrate carrying-out opening of the discharge chamber 105 so as to cover the exhaustion portion of the discharge chamber from above where the exhaust pipe 108 is open to exhaust the inside of the discharge chamber.

In FIG. 3, each of "a" and "c" indicates the shortest distance between the power application electrode 301 and the opening adjusting member 203, and "b" indicates a distance (an average distance) between the substrate 101 and a horizontal plane face of the power application electrode 301 which is opposed to the surface of the substrate 101.

In FIG. 4, reference numeral 401 indicates a power application electrode (corresponding to the power application electrode 106 in FIG. 1) which is electrically connected to the power source 202, and reference numeral 403 an opening adjusting member (corresponding to the opening adjusting member 111 in FIG. 1). As shown in FIG. 4, the power application electrode 401 is configured such that a face thereof on the substrate side has a curvely gradient pattern 404 (which forms a curvely gradient face) at each of its either side end portions. The gradient pattern 404 is curvely gradient downward from the substrate side so that the shortest distance with respect to the opening adjusting member always becomes constant. Further, as shown in FIG. 4, there are provided two opening adjusting members 403, one being provided at a substrate carrying-in opening of the discharge chamber 105 so as to cover the raw material gas introduction portion of the discharge chamber from above where the gas feed pipe 107 is open to introduce a raw material gas into the discharge chamber, and the other being provided at a substrate carrying-out opening of the discharge chamber 105 so as to cover the exhaustion portion of the discharge chamber from above where the exhaust pipe 108 is open to exhaust the inside of the discharge chamber.

In FIG. 4, each of "a" and "c" indicates the shortest distance between the power application electrode 401 and the opening adjusting member 403, and "b" indicates a distance (an average distance) between the substrate 101 and a horizontal plane face of the power application electrode 401 which is opposed to the surface of the substrate 101.

The power application electrode in the present invention is preferred to comprise a power application electrode having such configuration as shown in any of FIGS. 2 to 4.

The opening adjusting member (203, 303, 403) may be shaped in an adequate form as long as it can cover the foregoing raw material gas introduction portion or the foregoing exhaustion portion of the vacuum chamber (the discharge chamber). The opening adjusting member may be configured to have a gradient portion, for instance, as shown in FIG. 5 where there is shown an opening adjusting member 503 having a gradient face 505 which is opposed to a gradient face 504 of a power application electrode 501 (which is the same as the power application electrode 201 in FIG. 2).

In FIG. 5, each of "a" and "c" indicates the shortest distance between the power application electrode 501 and the opening adjusting member 503, and "b" indicates a distance (an average distance) between the substrate 101 and a horizontal plane face of the power application electrode 501 which is opposed to the surface of the substrate 101.

In any of the embodiments shown in FIGS. 2 to 5, the power application electrode (201, 301, 401, 501) and the opening adjusting member (203, 303, 403, 503) are always maintained to have a constant distance (a, c) [the shortest distance (a, c) between them. Because of this, the flow of raw material gas during the film formation is prevented from being disordered. In addition, the power application electrode (201, 301, 401, 501) and the substrate (101) are always maintained to have a constant distance (b) [the average distance (b)]between them. Because of this, a uniform plasma is generated in the discharge chamber (105) in a stable state without being disordered. Thus, a high quality deposited film is formed on the substrate.

Figure 9:
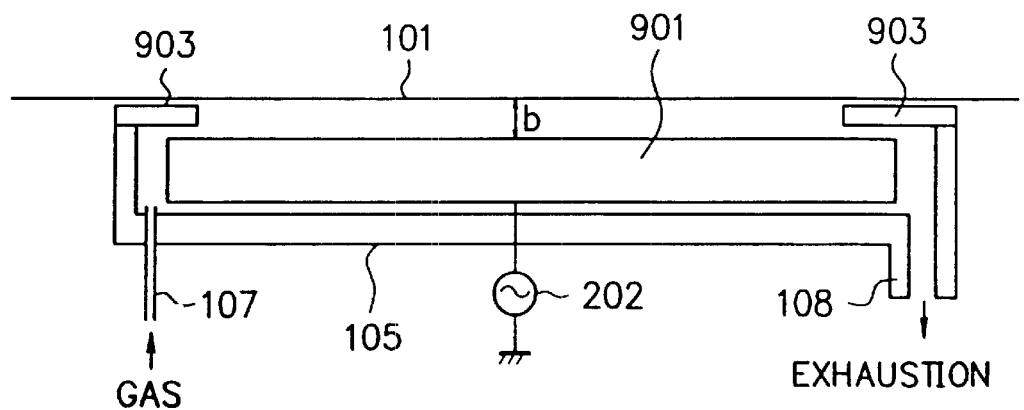
FIG. 9 is a schematic cross-sectional view illustrating an example of a positional arrangement of a power application electrode, an opening adjusting member, and a substrate in a conventional film-forming apparatus.

Independently, FIG. 9 is a schematic cross-sectional view illustrating an example of a positional arrangement relationship of a power application electrode, an opening adjusting member, and a substrate in a conventional film-forming apparatus. In FIG. 9, reference numeral 101 indicates a substrate (corresponding to the web substrate 101 in FIG. 1), reference numeral 105 a discharge chamber (corresponding to the discharge chamber 102 in FIG. 1), reference numeral 107 a gas feed pipe (corresponding to the gas feed pipe 107 in FIG. 1), and reference numeral 108 a exhaust pipe (corresponding to the exhaust pipe 108 in FIG. 1). Reference numeral 901 indicates a power application electrode which is electrically connected to a power source 202, and reference numeral 903 an opening adjusting member. The power application electrode 901 is shaped in a plate form with no gradient portion as shown in FIG. 9.

In the following, the present invention will be described in more detail with reference to examples. It should be understood that these examples are only for illustrative purposes and not intended to restrict the scope of the present invention.

In each of the following examples, film formation was conducted using the film-forming apparatus shown in FIG. 1 by adopting one of the above described positional arrangements therein.

Example 1

In this example, the positional arrangement shown in FIG. 2 was adopted in the film-forming apparatus shown in FIG. 1. The positional arrangement shown in FIG. 2 is designed so that the distance (a, c) between each opening adjusting member 203 and the power application electrode 201 becomes to be greater than the distance (b) between the power application electrode 201 and the substrate 101. The power application electrode 201 comprises a power application electrode configured as shown in FIG. 2, whose surface opposed to the substrate 101 has a gradient face portion 204 on the side of the raw material gas introduction portion (on the gas feed pipe 107 side) and a gradient face portion 204 on the side of the exhaustion portion (on the exhaust pipe 108 side).

Aforesaid power application electrode was adopted as the power application electrode 106 in the film-forming apparatus shown in FIG. 1. In accordance with the foregoing film-forming procedures using the film-forming apparatus shown in FIG. 1, film formation was conducted. Particularly, a gas mixture comprising $SiH_4$ gas and $H_2$ gas was flown into the discharge chamber 105 through the gas feed pipe 107, and a high frequency power with a frequency of 13.56 MHz was introduced into the discharge chamber through the power application electrode (201) to generated a plasma, whereby formation of an amorphous silicon film on a web substrate 101 being still was conducted for 5 minutes. In this case, in order to attain a high deposition rate for said amorphous silicon film formed on the web substrate, the distance (b) [see, FIG. 2] between the power application electrode (201) and the substrate 101 was made to be 20 mm.

In this example, as the power application electrode 106 in the film-forming apparatus shown in FIG. 1, it is possible to adopt a power application electrode configured as shown in FIG. 3, whose surface opposed to the substrate 101 has a stepwisely gradient face portion 304 on the side of the raw material gas introduction portion (on the gas feed pipe 107 side) and a stepwisely gradient face portion 304 on the side of the exhaustion portion (on the exhaust pipe 108 side).

Comparative Example 1

The procedures of Example 1 were repeated, except that as the power application electrode 106 in the film-forming apparatus shown in FIG. 1, a power application electrode (901) configured as shown in FIG. 9, whose surface opposed to the substrate 101 has no gradient face portion on the side of the raw material gas introduction portion (on the gas feed pipe 107 side) and on the side of the exhaustion portion (on the exhaust pipe 108 side), was used, whereby an amorphous silicon film was formed on a web substrate 101.

Evaluation

Figure 6:
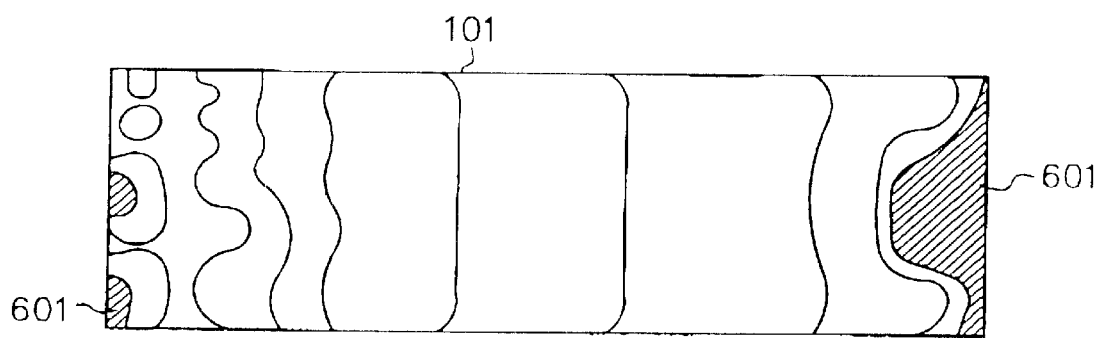
FIG. 6 is a schematic view showing thickness distributions of a deposited film formed on a substrate in Comparative Example 1 which will be described later, in which said thickness distributions are shown by constant-thickness lines.

For the amorphous silicon film obtained in Comparative Example 1, thickness distribution was examined by a conventional manner. FIG. 6 is a schematic view showing the examined thickness distribution of the amorphous silicon film, in which said thickness distributions are shown by constant-thickness lines.

Figure 7:
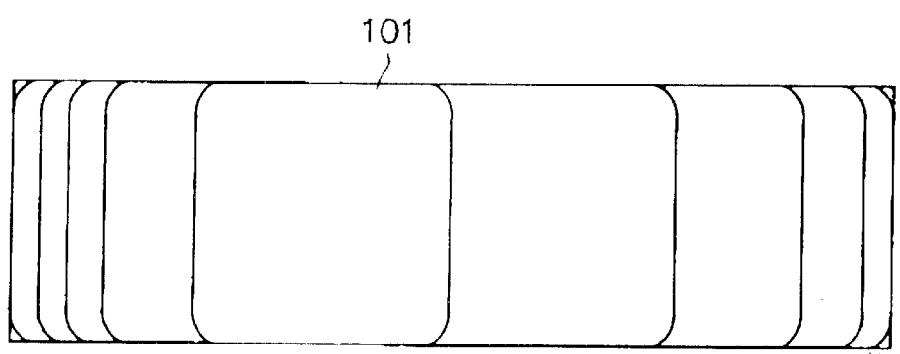
FIG. 7 is a schematic view showing thickness distributions of a deposited film formed on a substrate in Example 1 which will be described later, in which said thickness distributions are shown by constant-thickness lines.

Similarly, for the amorphous silicon film obtained in Example 1, thickness distribution was examined. FIG. 7 is a schematic view showing thickness of the examined distributions of the amorphous silicon film, in which said thickness distributions are shown by constant-thickness lines.

In Comparative Example 1, as FIG. 6 illustrates, it was found that on a surface portion of the substrate in a region in the vicinity of the raw material gas introduction portion and also on a surface portion of the substrate in a region in the vicinity of the exhaustion portion, a film was not deposited but polysilane power 601 (dust) was deposited, and that significant uneven thickness distributions were occurred for films formed on other surface portions of the substrate. For the reason for this situation, it is considered such that as a result of having narrowed the distance (b) [see, FIG. 9] between the power application electrode (901) and the substrate 101, the distance between the power application electrode (901) and the opening adjusting member (903) became remarkably narrowed, and as a result, the flow of the raw material gas and the plasma generated were disordered, and polysilane power was occurred.

On the other hand, in Example 1, as FIG. 7 illustrates, it was found that on a surface portion of the substrate in a region in the vicinity of the raw material gas introduction portion and also on a surface portion of the substrate in a region in the vicinity of the exhaustion portion, a desirable film was deposited without having occurring of polysilane power and undesirable uneven thickness distributions were not occurred for films formed on other surface portions of the substrate.

Example 2

In this example, the positional arrangement shown in FIG. 4 was adopted in the film-forming apparatus shown in FIG. 1. The positional arrangement shown in FIG. 4 is designed so that the distance (a, c) between each opening adjusting member 403 and the power application electrode 401 becomes to be substantially the same as the distance (b) between the power application electrode 401 and the substrate 101. The power application electrode 401 comprises a power application electrode configured as shown in FIG. 4, whose surface opposed to the substrate 101 has a curvely gradient face portion 404 on the side of the raw material gas introduction portion (on the gas feed pipe 107 side) and a curvely gradient face portion 404 on the side of the exhaustion portion (on the exhaust pipe 108 side).

Aforesaid power application electrode was adopted as the power application electrode 106 in the film-forming apparatus shown in FIG. 1. In accordance with the foregoing film-forming procedures using the film-forming apparatus shown in FIG. 1, film formation was conducted. Particularly, a gas mixture comprising $SiH_4$ gas and $H_2$ gas was flown into the discharge chamber 105 through the gas feed pipe 107, and a high frequency power with a frequency of 13.56 MHz was introduced into the discharge chamber through the power application electrode (401) to generated a plasma, whereby formation of an amorphous silicon film on a web substrate 101 being still was conducted for 5 minutes. In this case, in order to attain a high deposition rate for said amorphous silicon film formed on the web substrate, the distance (b) [see, FIG. 4] between the power application electrode (401) and the substrate 101 was made to be 20 mm.

Evaluation

1. In this example, no polysilane powder was occurred. And the amorphous silicon film obtained in this example was found to have such thickness distributions as shown in FIG. 7 which do not have undesirable uneven thickness distributions.

Figure 8:
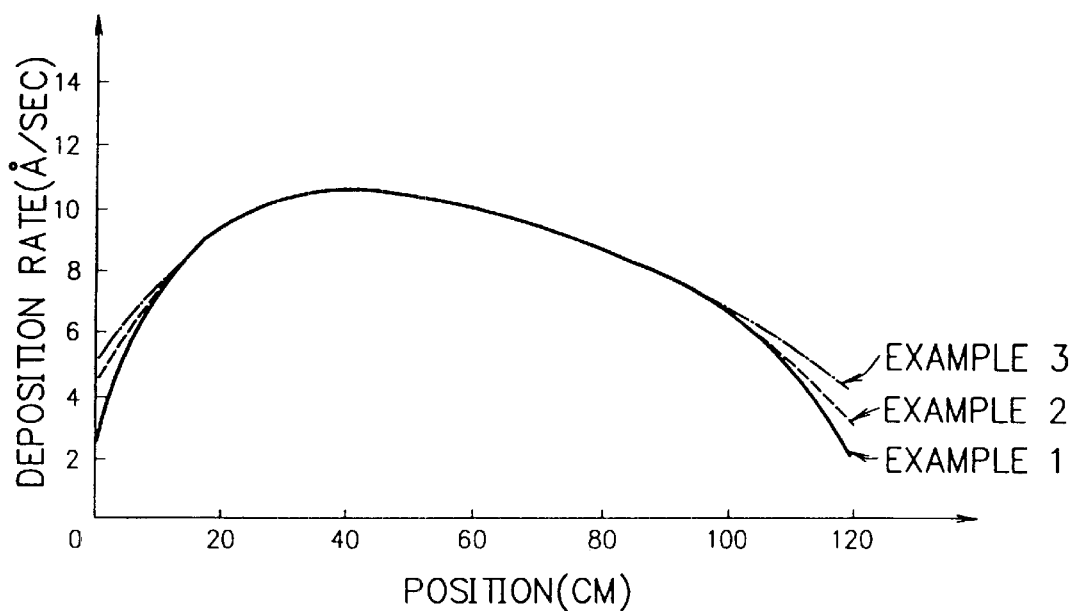
FIG. 8 is a graph showing deposition rate distributions of deposited films obtained in Examples 1 to 3 which will be described later.

2. There was examined a deposition rate distribution for the amorphous silicon film obtained in Example 1. There was also examined a deposition rate distribution for the amorphous silicon film obtained in Example 2 (this example). The examined results are graphically in FIG. 8, where there is together shown a deposition rate distribution of the amorphous silicon film obtained in Example 3 which will be described below.

In comparison of the deposition rate of Example 2 with that of Example 1, it is understood that the deposition rate of Example 2 is somewhat increased in a region in the vicinity of the raw material gas introduction portion and in a region in the vicinity of the exhaustion portion but it is prevented from being suddenly changed. For the reason for this situation, it is considered such that because the distance (a, c) between each opening adjusting member (403) and the power application electrode (401) was the same as the distance (b) between the power application electrode (401) and the substrate 101, disorder in the plasma generated was diminished.

Example 3

In this example, the positional arrangement shown in FIG. 5 was adopted in the film-forming apparatus shown in FIG. 1. The positional arrangement shown in FIG. 5 is designed so that the distance (a, c) between each opening adjusting member 503 and the power application electrode 501 becomes to be substantially the same as the distance (b) between the power application electrode 501 and the substrate 101. The power application electrode 501 comprises a power application electrode configured as shown in FIG. 5, whose surface opposed to the substrate 101 has a gradient face portion 504 on the side of the raw material gas introduction portion (on the gas feed pipe 107 side) and a gradient face portion 504 on the side of the exhaustion portion (on the exhaust pipe 108 side). And each opening adjusting member 503 comprises an opening adjusting member of such form as shown in FIG. 5 having a gradient face 505 which is opposed to the gradient face portion 504 of said power application electrode.

Aforesaid power application electrode (501) was adopted as the power application electrode 106 in the film-forming apparatus shown in FIG. 1. And as each of the two opening adjusting members 111 in the film-forming apparatus shown in FIG. 1, aforesaid opening adjusting member (503) was used.

In accordance with the foregoing film-forming procedures using the film-forming apparatus shown in FIG. 1, film formation was conducted. Particularly, a gas mixture comprising $SiH_4$ gas and $H_2$ gas was flown into the discharge chamber 105 through the gas feed pipe 107, and a high frequency power with a frequency of 13.56 MHz was introduced into the discharge chamber through the power application electrode (501) to generated a plasma, whereby formation of an amorphous silicon film on a web substrate 101 being still was conducted for 5 minutes. In this case, in order to attain a high deposition rate for said amorphous silicon film formed on the web substrate, the distance (b) [see FIG. 5] between the power application electrode (501) and the substrate 101 was made to be 20 mm.

Evaluation

1. In this example, no polysilane powder was occurred. And the amorphous silicon film obtained in this example was found to have such thickness distributions as shown in FIG. 7 which do not have undesirable uneven thickness distributions.

2. There was examined a deposition rate distribution for the amorphous silicon film obtained in Example 3 (this example). The examined result is graphically in FIG. 8, where there are together shown the deposition rate distribution of the amorphous silicon film obtained in Example 1 and the deposition rate distribution of the amorphous silicon film obtained in Example 2.

In comparison of the deposition rate of Example 3 with that of Example 1 or that of Example 2, it is understood that the deposition rate of Example 3 is more increased in a region in the vicinity of the raw material gas introduction portion and in a region in the vicinity of the exhaustion portion but it is prevented from being suddenly changed. For the reason for this situation, it is considered such that because the distance (a, c) between each opening adjusting member (503) and the power application electrode (501) was the same as the distance (b) between the power application electrode (501) and the substrate 101, disorder in the plasma generated was diminished and disorder in the flow of the raw material gas was also diminished.

As described in the above, the present invention resides in an improvement in a film-forming apparatus comprising a substantially enclosed vacuum chamber whose inside being capable of being evacuated, a power application electrode for introducing a discharging power into said vacuum chamber, a raw material gas introduction portion through which a raw material gas is introduced into said vacuum chamber, an exhaustion portion through which said vacuum chamber is exhausted, and an opening adjusting member for intercepting said raw material gas introduction portion or said exhaustion portion, and said power application electrode being arranged so as to oppose a substrate positioned in said vacuum chamber, wherein a discharging power is introduced through said power application electrode to generate a plasma in a discharge space between said power application electrode and said substrate to decompose a raw material gas introduced through said raw material gas introduction portion whereby causing deposition of a film on said substrate, wherein a side end portion of said power application electrode which is situated in the vicinity of said opening adjusting member is made to be in a gradient form or a stepwise form or in addition, said opening adjusting member is made have a face in a gradient form or the like which is opposed to said side end portion of said power application electrode, whereby the shortest distance (a, c) between said power application electrode and said opening adjusting member is made to be substantially the same as or greater than the distance (b) between said power application electrode and said substrate. By this constitution, even when the distance (b) between the power application electrode and the substrate is narrowed in order to increase the deposition rate for a deposited film formed on the substrate, the flow of the raw material gas in the vacuum chamber is prevented from being disordered and in addition, the plasma generated in the vacuum chamber is prevented from being disordered. Particularly, in the case where a structure in that the shortest distance (a, c) between the power application electrode and the opening adjusting member is made to be substantially the same as the distance (b) between the power application electrode and the substrate (see, Example 2) is adopted, although the configuration of the power application electrode is somewhat complicated, disorder in the plasma generated in the vacuum chamber is markedly diminished and as a result, uniform deposition rate distribution can be attained over a more large area. And in the case where a structure in that a side end portion of the power application electrode which is situated in the vicinity of the opening adjusting member is made to be in a gradient form, the opening adjusting member is made have a face in a gradient form which is opposed to said gradient side end portion of the power application electrode, and the shortest distance (a, c) between the power application electrode and the opening adjusting member is made to be substantially the same as the distance (b) between the power application electrode and the substrate (see, Example 3) is adopted, not only disorder in the plasma generated in the vacuum chamber is markedly diminished but also smooth gas flow with no disorder of the raw material gas is attained and as a result, more uniform deposition rate distribution can be attained over a more large area. Because of this, a high quality functional deposited film as a semiconductor film can be stably and continuously formed on a desired substrate. This situation makes it possible to mass-produce a thin film semiconductor device such as a solar cell at a reasonable production cost.

Separately, in each of the foregoing examples, description has been made in the case of using a roll-to-roll type film-forming apparatus. However, the constitution of the present invention can be applied also in a batch type film-forming apparatus.

What is claimed is:

1. A film-forming apparatus comprising a substantially enclosed vacuum chamber whose inside being capable of being evacuated, a power application electrode having a desired thickness for introducing a discharging power into said vacuum chamber, a raw material gas introduction potion through which a raw material gas is introduced into said vacuum chamber, and an exhaustion portion through which said vacuum chamber is exhausted, said power application electrode being arranged so as to oppose a substrate positioned in said vacuum chamber, wherein a discharging power is introduced through said power application electrode to generate a plasma in a discharge space between said power application electrode and said substrate to decompose a raw material gas introduced through said raw material gas introduction portion whereby causing deposition of a film on said substrate, characterized in that at least said raw material gas introduction portion or said exhaustion portion is provided with an opening adjusting member having a desired thickness for intercepting said plasma, and said power application electrode and said opening adjusting member are arranged to satisfy an equation a or $c \geq b$, with a being a shortest distance between said power application electrode and said opening adjusting member provided at said raw material gas introduction portion, c being a shortest distance between said power application electrode and said opening adjusting member provided at said exhaustion portion, and b being an average distance between said substrate and a horizontal plane face of said power application electrode which is opposed to a face of said substrate.

2. The film-forming apparatus according to claim 1, wherein a face of a side end portion of said power application electrode on a side of said substrate has a gradient configuration in that the thickness of said power application electrode is decreased toward a lower end portion of said side portion of said power application electrode.

3. The film-forming apparatus according to claim 2, wherein a face of said opening adjusting member on a side of said power application electrode has a gradient configuration in that the thickness of said opening adjusting member is gradually decreased toward an opening portion of said vacuum chamber where said substrate is exposed to the inside of said vacuum chamber.

4. A film-forming method using a film-forming apparatus comprising a substantially enclosed vacuum chamber whose inside being capable of being evacuated; a power application electrode having a desired thickness for introducing a discharging power into said vacuum chamber, a raw material gas introduction portion through which a raw material gas is introduced into said vacuum chamber, and an exhaustion portion through which said vacuum chamber is exhausted, wherein a substrate is positioned in said vacuum chamber, a discharging power is introduced through said power application electrode to generate a plasma in a discharge space between said power application electrode and said substrate to decompose a raw material gas introduced through said raw material gas introduction portion whereby causing deposition of a film on said substrate, characterized in that at least said raw material gas introduction portion or said exhaustion portion is provided with an opening adjusting member having a desired thickness for intercepting said plasma, and said power application electrode and said opening adjusting member are arranged to satisfy an equation a or $c \geq b$, with a being a shortest distance between said power application electrode and said opening adjusting member provided at said raw material gas introduction portion, c being a shortest distance between said power application electrode and said opening adjusting member provided at said exhaustion portion, and b being an average distance between said substrate and a horizontal plane face of said power application electrode which is opposed to a face of said substrate.

5. The film-forming method according to claim 4, wherein a face of a side end portion of said power application electrode on a side of said substrate has a gradient configuration in that the thickness of said power application electrode is decreased toward a lower end portion of said side portion of said power application electrode.

6. The film-forming method according to claim 5, wherein a face of said opening adjusting member on a side of said power application electrode has a gradient configuration in that the thickness of said opening adjusting member is gradually decreased toward an opening portion of said vacuum chamber where said substrate is exposed to the inside of said vacuum chamber.

* * * * *